US008697987B2

(12) United States Patent
Cotal et al.

(10) Patent No.: US 8,697,987 B2
(45) Date of Patent: Apr. 15, 2014

(54) SOLAR CELL HAVING FRONT GRID METALLIZATION THAT DOES NOT CONTACT THE ACTIVE LAYERS

(75) Inventors: Hector L. Cotal, Newhall, CA (US); Raed A. Sherif, Valencia, CA (US)

(73) Assignee: The Boeing Company, Chicago, IL (US)

(*) Notice: Subject to any disclaimer, the term of this patent is extended or adjusted under 35 U.S.C. 154(b) by 1715 days.

(21) Appl. No.: 10/961,256

(22) Filed: Oct. 8, 2004

(65) Prior Publication Data
US 2006/0076049 A1    Apr. 13, 2006

(51) Int. Cl.
*H01L 31/042*    (2006.01)

(52) U.S. Cl.
USPC .......................................... 136/256

(58) Field of Classification Search
USPC .......................................... 136/256
See application file for complete search history.

(56) References Cited

U.S. PATENT DOCUMENTS

| | | | |
|---|---|---|---|
| 4,055,442 A | 10/1977 | Crosher | |
| 4,359,487 A | 11/1982 | Schneider | |
| 5,116,427 A * | 5/1992 | Fan et al. | 136/259 |
| 5,141,564 A | 8/1992 | Chen et al. | |
| 5,689,123 A | 11/1997 | Major et al. | |
| 6,100,546 A | 8/2000 | Major et al. | |
| 6,130,147 A | 10/2000 | Major et al. | |
| 6,255,580 B1 | 7/2001 | Karam et al. | |
| 6,281,426 B1 | 8/2001 | Olson et al. | |
| 6,479,316 B1 | 11/2002 | Hanoka et al. | |
| 6,600,100 B2 * | 7/2003 | Ho et al. | 136/255 |
| 2003/0070707 A1 * | 4/2003 | King et al. | 136/255 |
| 2003/0140962 A1 * | 7/2003 | Sharps et al. | 136/249 |
| 2003/0145884 A1 * | 8/2003 | King et al. | 136/255 |
| 2003/0172969 A1 | 9/2003 | Jenson et al. | |
| 2004/0065363 A1 * | 4/2004 | Fetzer et al. | 136/262 |
| 2006/0225775 A1 * | 10/2006 | Ishihara | 136/244 |

OTHER PUBLICATIONS

"An Overview of Level Set Methods for Etching, Deposition, and Lithography Development" IEEE Transactions on Semiconductor Manufacturing, vol. 10, No. 1, Feb. 1997; FIG. 24(c).*

* cited by examiner

*Primary Examiner* — Jennifer Michener
*Assistant Examiner* — Dustin Q Dam
(74) *Attorney, Agent, or Firm* — Smith Moore Leatherwood LLP

(57) ABSTRACT

A solar cell has a photovoltaic element having a back electrical contact, and a front current-collection grid cap structure overlying and contacting the photovoltaic solar cell element. The front current-collection grid cap structure is made of a doped semiconductor material and has openings therethrough to the photovoltaic solar cell element. An anti-reflection layer formed of an anti-reflection material overlies and contacts the photovoltaic solar cell element in the openings of the front current-collection grid cap structure. An edge stripe of a cap-top protective material, preferably the same as the anti-reflection material, overlies and contacts each top grid-cap margin of the top cap structure but not a top grid-cap central region of the top cap-structure. A metallic electrical current collector overlies and contacts the top cap structure and at least some of the edge stripe, but does not contact the anti-reflection layer and does not contact the photovoltaic solar cell element.

13 Claims, 2 Drawing Sheets

SOLAR CELL HAVING FRONT GRID METALLIZATION THAT DOES NOT CONTACT THE ACTIVE LAYERS

This invention relates to a solar cell, and more particularly to a solar cell operated at elevated temperatures such as a concentrator solar cell.

BACKGROUND OF THE INVENTION

A solar cell is a photovoltaic (PV) device having one or more p-n junctions. Each junction comprises two different regions within a semiconductor material where one side is denoted as the p-type region and the other as the n-type region. When light, specifically solar light, is incident upon these regions, the light is directly converted to electricity through the PV effect. In the PV effect, light-generated carriers (electrons) are collected, and can either be conducted away as an electrical current or remain in the device to give rise to a voltage, termed a photovoltage.

The solar cell may operate with sunlight of normal intensity, or the sunlight may be concentrated onto the solar cell using a mirror or a lens. Concentrator solar cells having multiple stacked junctions produce the highest conversion efficiencies of light to electricity. Concentrator solar cell systems with concentration ratios ranging from 100 to 500 suns are contemplated, and even higher concentration ratios may be used in the future. The temperature of such concentrator solar cells may reach 300° C. or higher during operation, depending upon the environment for which the solar cell was designed.

In the work leading to the present invention, testing of concentrator solar cells operating over extended periods of time at elevated temperatures has led to premature failures that are not typically observed in conventional non-concentrator solar cells. If they are not built properly, the concentrator solar cells may have a higher risk of failure than non-concentrator solar cells. The premature failure is of particular concern because it is expected that the concentrator solar cells will find use to power spacecraft for earth-orbiting and deep-space missions, where the concentrator solar cells cannot be readily replaced in the event of a failure.

There is therefore a need for an improved approach to the structure of solar cells, particularly solar cells that are to be used in concentrator applications that require high-temperature operation. The present invention fulfills this need, and further provides related advantages.

SUMMARY OF THE INVENTION

The present invention provides a solar cell structure that is particularly suitable for use as a concentrator solar cell. With the present approach, premature failure due to interdiffusion of metallic species into the photovoltaic semiconductor layers of the solar cell is reduced and, desirably, avoided entirely. The performance of the solar cell is not adversely affected by the design modifications of the present approach.

In accordance with the invention, a solar cell structure includes a photovoltaic solar cell element having a back electrical contact, and a front current-collection grid cap structure overlying and contacting the photovoltaic solar cell element. The photovoltaic solar cell element may be of any operable single-junction or multi-junction type. The front current-collection grid cap structure is made of a doped semiconductor material having openings therethrough to the photovoltaic solar cell element. The grid cap structure has a top cap structure formed of grid lines, wherein each grid line has two top grid-cap margins and a top grid-cap central region, and a grid-cap side. An anti-reflection layer formed of an anti-reflection material overlies and contacts the photovoltaic solar cell element in the openings of the front current-collection grid cap structure. The anti-reflection layer is ordinarily thinner at a location immediately adjacent to the front current-collection grid cap structure than at a location remote from the front current-collection grid cap structure. A metallic electrical current collector overlies and contacts the top grid-cap central region, but does not contact the anti-reflection layer and does not contact the photovoltaic solar cell element.

Desirably, an edge stripe of a cap-top protective material, which is preferably the anti-reflection material, overlies and contacts each top grid-cap margin but not the top grid-cap central region of the cap-structure. Additionally, there is desirably a side layer of a cap-side protective material, which is preferably the anti-reflection material, overlying and contacting the grid-cap side.

The solar cell structure preferably is a concentrator solar cell device, so that the structure further includes a concentrator that concentrates solar energy onto the photovoltaic solar cell element. The concentrator solar cell device operates in a harsh, high-temperature environment. As a result of the heat generated from the concentrated light and from the heat from the environment, the solar cell is heated to an elevated temperature. In conventional designs where the metallic electrical current collector contacts the photovoltaic solar cell element and/or the anti-reflection layer, at such elevated temperatures metal atoms can diffuse from the electrical current collector into the photovoltaic solar cell element and degrade the performance of the semiconductor photovoltaic device. In the present approach, on the other hand, the metal of the electrical current collector does not contact either the photovoltaic solar cell element or the anti-reflection coating, so that metal cannot diffuse into the photovoltaic solar cell element to cause degradation of its performance.

In another embodiment, a solar cell structure comprises a photovoltaic solar cell element having a back electrical contact, and a front current-collection grid cap structure overlying and contacting the photovoltaic solar cell element. The front current-collection grid cap structure is made of a highly doped semiconductor material and has openings therethrough to the photovoltaic solar cell element. The grid cap structure has a top cap structure formed of grid lines, wherein each grid line has two top grid-cap margins and a top grid-cap central region, and a grid-cap side. An anti-reflection layer formed of an anti-reflection material overlies and contacts the photovoltaic solar cell element in the openings of the front current-collection grid cap structure. An edge stripe of a cap-top protective material, preferably the same material as the anti-reflection material, overlies and contacts each top grid-cap margin but not the top grid-cap central region of the cap-structure. A metallic electrical current collector overlies and contacts the top grid-cap central region and at least some of the edge stripe, but does not contact the anti-reflection layer and does not contact the photovoltaic solar cell element. Other operable features as described herein may be used with this embodiment as well.

The present approach provides a solar cell structure that is particularly advantageous at elevated-temperatures, such as found in a concentrator solar cell application. Degradation of performance due to interdiffusion of the front-side metallization into the semiconductor photovoltaic solar cell element is reduced or avoided.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
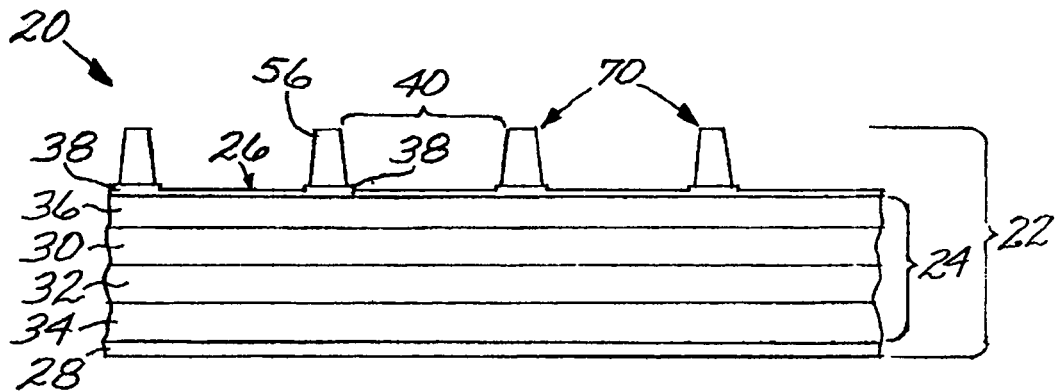
FIG. 1 is an elevational view of a solar cell.
Figure 2:
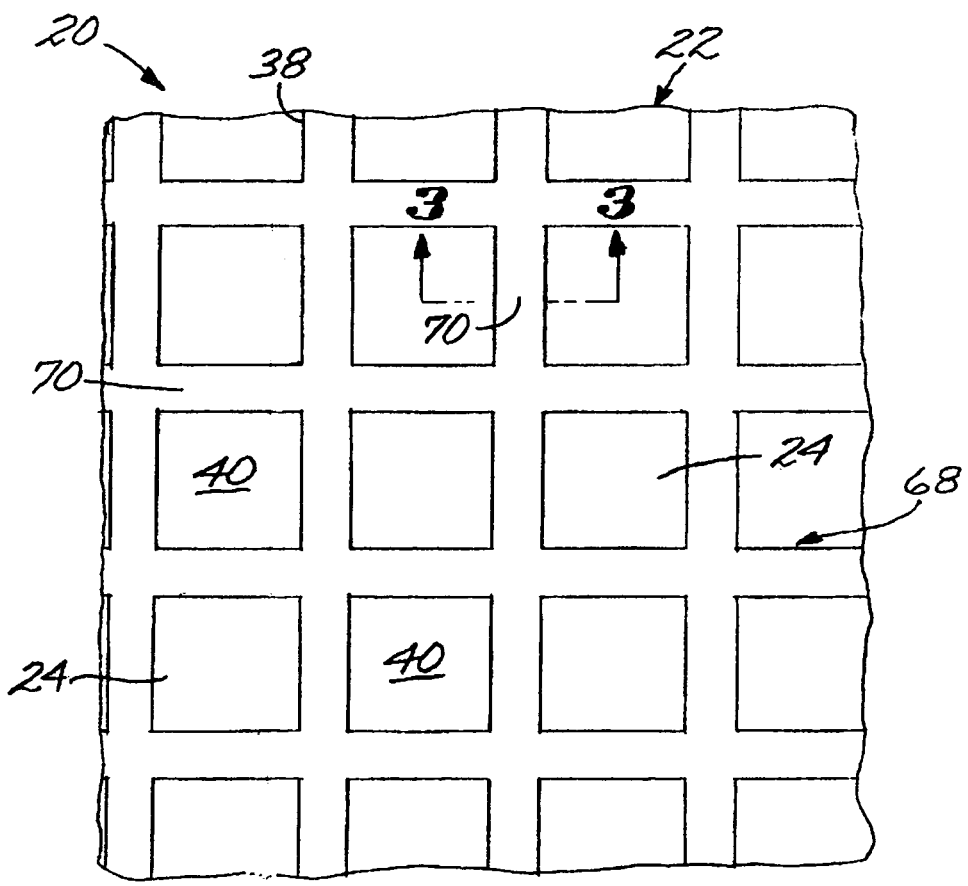
FIG. 2 is a plan view of the front side of the solar cell of FIG. 1.

FIGS. 1 and 2 depict a solar cell structure 20 having a solar cell 22. (The figures are not drawn to scale, and in some cases layers which are very thin in reality are drawn as thicker so that they may be seen at the scale of the drawing.) The solar cell 22 includes a photovoltaic solar cell element 24 that generates an electrical potential, when illuminated, between its front side 26, and a back electrical contact 28. The photovoltaic solar cell element 24 may include a single photovoltaic subcell, or multiple (in the illustration, three) photovoltaic subcells 30, 32, and 34, with an overlying protective window 36. The photovoltaic solar cell element 24 is made of photovoltaic semiconductor materials. Such photovoltaic solar cell elements 24 and back electrical contacts 28 are known in the art, see for example U.S. Pat. Nos. 5,689,123; 6,281,426; 6,100,546; and 6,130,147, all of which are incorporated by reference.

The solar cell 22 further includes a front current-collection grid cap structure 38 overlying and contacting the photovoltaic solar cell element 24. The front current-collection grid cap structure 38 is made of a highly doped semiconductor material. The current-collector grid cap structure 38 defines a grid 68 comprising a plurality of intersecting grid lines 70 on the front side 26 of the solar cell 22. The grid 68 has openings 40 therethrough to the photovoltaic solar cell element 24. Incident light, particularly incident sunlight, on the front side 26 of the solar cell 22 illuminates the voltage-producing photovoltaic solar cell element 24 through the openings. The photovoltaic solar cell element 24 produces a voltage between the current-collector grid cap structure 38 and the back electrical contact 28.

Figure 3:
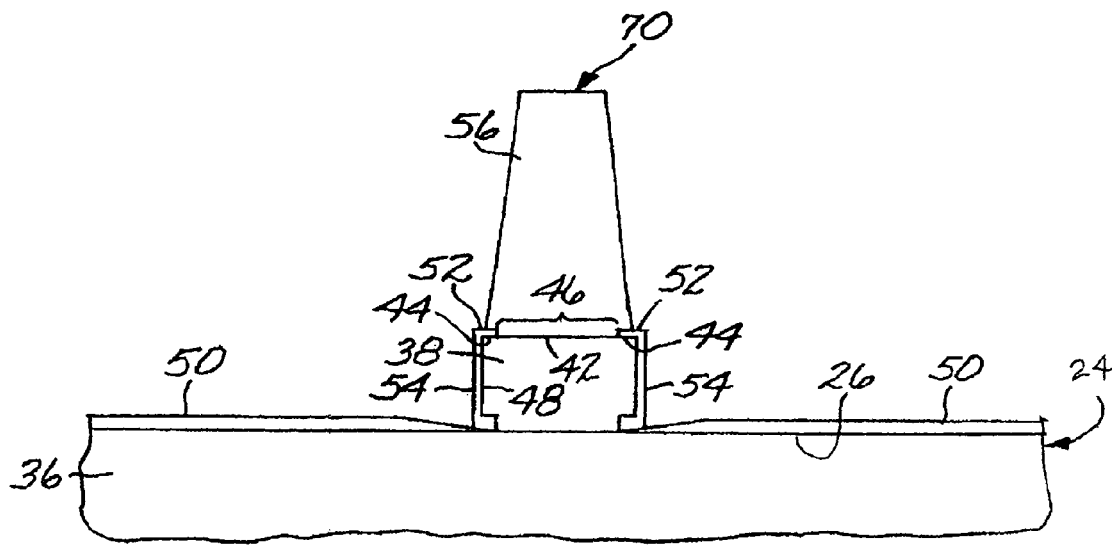
FIG. 3 is an enlarged sectional view of the solar cell of FIGS. 1 and 2, taken on line 3-3 of FIG. 2.

FIG. 3 illustrates the structure at the front side 26 of the solar cell 22 in greater detail. Each grid line 70 of the current-collector grid cap structure 38 may be described as having a top cap structure 42. The top cap structure 42 has two top grid-cap margins 44 and a top grid-cap central region 46. The current-collector grid cap structure 38 also has two grid-cap sides 48.

An anti-reflection layer 50 formed of an anti-reflection material overlies and contacts the photovoltaic solar cell element 24 in the openings 40 of the front-side current-collection grid cap structure 38. The anti-reflection layer 50 minimizes the amount of incident energy that is reflected away and thence does not reach the photovoltaic solar cell element 24. Anti-reflection layers having one layer, or two or more sublayers, are known in the art and are discussed, for example, in U.S. Pat. Nos. 4,055,442 and 5,141,564, whose disclosures are incorporated by reference. The presently preferred anti-reflection-material is alumina based. In the usual case as illustrated in FIG. 3, the anti-reflection layer 50 is thinner at a location immediately adjacent to the front current-collection grid cap structure 38 than at a location remote from the front current-collection grid cap structure 38. This variation in structure arises from the manner in which the anti-reflection layer 50 is deposited onto the surface of the photovoltaic solar cell element 24.

An edge stripe 52 of a cap-top protective material overlies and contacts each top grid-cap margin 44 but not the top grid-cap central region 46. The cap-top protective material is preferably the same material as the anti-reflection material. Optionally but preferably, a side layer 54 of a cap-side protective material overlies and contacts each grid-cap side 48. The thinner cap-side protective material is preferably the same material as the anti-reflection material. The edge stripe 52 and the side layer 54 protect the covered portions of the semiconductor grid-cap structure 38 from environmental damage, such as damage from water or corrosive gases that may otherwise come into contact with the semiconductor grid-cap structure.

A metallic electrical current collector 56 overlies and contacts the top grid-cap central region 46. The metallic electrical current collector 56 does not contact the anti-reflection layer 50 and does not contact the photovoltaic solar cell element 24. The metallic electrical current collector 56 serves as the primary electrical conduction path from the front side 26 of the photovoltaic solar cell element 24. The metallic electrical current collector 56 also, in combination with the edge stripe 52 and the side layer 54, protects the semiconductor grid-cap structure 38 from environmental damage.

Care is taken that the metallic electrical current collector 56 does not contact the anti-reflection layer 50 and does not contact the photovoltaic solar cell element 24. Particularly in an application where the solar cell 22 is heated to an elevated temperature, metal from the metallic electrical current collector 56 could diffuse through the anti-reflection layer 50 and into the photovoltaic solar cell element 24 if there were such a contact. In conventional solar cell designs, the width of the metallic electrical current collector is not limited to be such that it contacts only the central region of the grid-cap structure, and instead is allowed to extend over the sides of the grid-cap structure to deposit upon the anti-reflection layer and/or the photovoltaic solar cell element. The overlapping of the deposited metal for the metallic electrical current collector may occur incidentally, regardless of the intended design, because the problem has not been previously recognized and therefore deposition masks are not sized and positioned to precisely limit the extent of the metallic deposition. In drawings of prior art devices, deposited metal may be sketched as non-overlapping, but, in the absence of a specific provision to avoid overlap, incidental deposition typically occurs to produce an overlap of the deposited metal and the photovoltaic solar cell element.

This overly wide metallic deposition structure found in conventional designs does not create a major problem in most solar cell applications, where the solar cell is not heated to a temperature sufficiently high that the metal of the metallic electrical current collector can diffuse into the active photovoltaic solar cell element 24. For the present applications of interest, such as a concentrator solar cell used in an environment where the solar cell is heated to at least several hundred degrees Centigrade, there may be such a detrimental diffusion of the metallic material of the current collector, producing a "metal spike" in the photovoltaic solar cell element 24 that introduces unintended metallic dopant and thereby degrades its photovoltaic properties. The present approach prevents this metal spike phenomenon, thereby producing a solar cell structure 20 that is more robust and resistant to degradation in elevated-temperature situations. In the present approach, deposition masks are carefully sized and positioned to limit the extent of the metallic deposition for the metallic electrical current collector 56 so that it does not extend beyond the top cap structure 42. The deposition masks cannot be positioned so precisely that, in the absence of the edge stripe 52, deposition on the photovoltaic solar cell element 24 may be avoided and at the same time the grid-cap structure 38 is fully protected. The presence of the edge stripe 52 provides that combination of protection of the edge-cap structure 38 and the ability to limit the lateral extent of the deposition of the metallic electric current collector 56.

Figure 4:
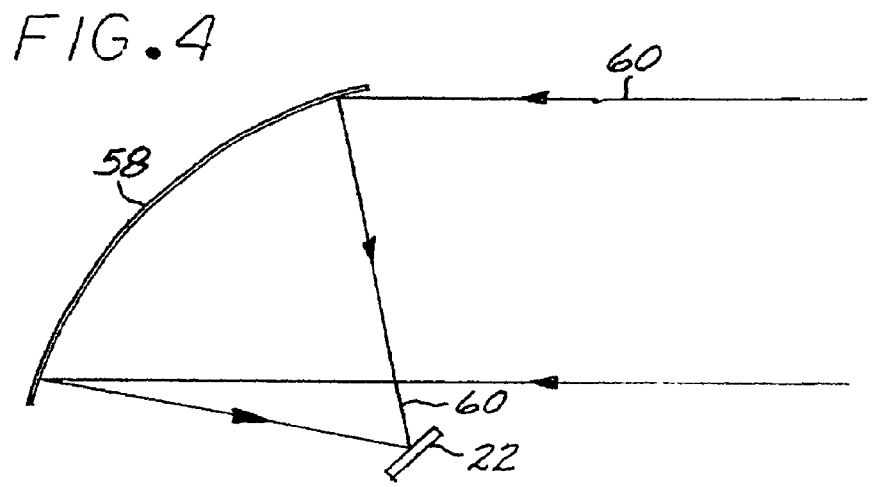
FIG. 4 depicts a solar cell structure having a solar cell and a concentrator mirror.

FIG. 4 illustrates the preferred application of the solar cell 22, in the concentrator solar cell structure 20. The solar cell structure 20 includes a mirror 58 or other optical device, such as a lens, that concentrates a sunlight beam 60 onto the photovoltaic solar cell element 24. The concentration may be as high as to produce light incident upon the solar cell element 24 hundreds of times more intense than natural sunlight. The increased light intensity as well as any environmental heating, heats the solar cell 22 to a much higher temperature than does natural sunlight. The solar cell design and photoactive materials of the solar cell 22 are selected to operate in this elevated-temperature environment. This performance of the solar cell 22 would otherwise be degraded by the metal spike mechanism discussed earlier, but the present structure prevents the occurrence of such degradation.

The present approach has wide applicability, but is particularly useful with a concentrator solar cell that is to be used in a harsh, high-temperature environment. An example is an unmanned planetary probe that is to land on a planet such as Venus. A non-concentrating solar cell array would not produce sufficient power for an available array size due to the elevated temperature of the environment. In a concentrating solar cell array, however, since the solar cells are heated from both the environment and the concentrated sunlight, power would still be produced to operate the array. A conventional concentrating solar array is expected to have limited reliability in this elevated-temperature environment due to metallic diffusion from the grids into the semiconductor active solar cell elements. The grid-structure design of the present approach prevents such metallic diffusion, thereby prolonging the life of the solar cell structure.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A solar cell structure comprising:
    a photovoltaic solar cell element having a back electrical contact;
    a front current-collection grid cap structure overlying and contacting the photovoltaic solar cell element and defining openings therethrough to the photovoltaic solar cell element, wherein the front current-collection grid cap structure comprises a grid cap structure made of a doped semiconductor material overlying and contacting the photovoltaic solar cell element, the grid cap structure comprising a top grid-cap central region, grid-cap sides, and top grid cap margins disposed between and contacting the top grid-cap central region and the grid-cap sides;
    an anti-reflection layer formed of an anti-reflection material overlying and contacting the photovoltaic solar cell element in the openings of the front current-collection grid cap structure;
    an edge stripe of anti-reflection material completely overlying and contacting the top grid-cap margins but not the top grid-cap central region; and
    a metallic electrical current collector overlying and contacting the top grid-cap central region, but not contacting the top grid cap margins, the grid-cap sides, the anti-reflection layer and the photovoltaic solar cell element.

2. The solar cell structure of claim 1, wherein the anti-reflection layer is thinner at a location immediately adjacent to the front current-collection grid cap structure than at a location remote from the front current-collection grid cap structure.

3. The solar cell structure of claim 1, further including a side layer of a cap-side protective material overlying and contacting the grid-cap side.

4. The solar cell structure of claim 1, further including a side layer of the anti-reflection material overlying and contacting the grid-cap side.

5. The solar cell structure of claim 1, further including a concentrator that concentrates solar energy onto the photovoltaic solar cell element.

6. A solar cell structure comprising:
    a photovoltaic solar cell element having a back electrical contact;
    a front current-collection grid cap structure overlying and contacting the photovoltaic solar cell element and defining openings therethrough to the photovoltaic solar cell element, wherein the front current-collection grid cap structure comprises a grid cap structure made of a doped semiconductor material overlying and contacting the photovoltaic solar cell element, the grid cap structure comprising a top grid-cap central region, grid-cap sides and top grid cap margins disposed between and contacting the top grid-cap central region and the grid-cap sides;
    an anti-reflection layer formed of an anti-reflection material overlying and contacting the photovoltaic solar cell element in the openings of the front current-collection grid cap structure;
    an edge stripe of anti-reflective material completely overlying and contacting the top grid-cap margins but not the top grid-cap central region; and
    a metallic electrical current collector overlying and contacting the top grid-cap central region and at least some of the edge stripe, but not contacting the top grid cap margins, the grid-cap sides, the anti-reflection layer and the photovoltaic solar cell element.

7. The solar cell structure of claim 6, wherein the anti-reflection layer is thinner at a location immediately adjacent to the front current-collection grid cap structure than at a location remote from the front current-collection grid cap structure.

8. The solar cell structure of claim 6, further including a side layer of a cap-side protective material overlying and contacting the grid-cap side.

9. The solar cell structure of claim 6, further including a side layer of the anti-reflection material overlying and contacting the grid-cap side.

10. The solar cell structure of claim 6, further including a concentrator that concentrates solar energy onto the photovoltaic solar cell element.

11. A solar cell structure comprising:
    a photovoltaic solar cell element having a back electrical contact;
    a front current-collection grid cap structure overlying and contacting the photovoltaic solar cell element and defining openings therethrough to the photovoltaic solar cell element, wherein the front current-collection grid cap structure comprises a grid cap structure made of a doped semiconductor material overlying and contacting the photovoltaic solar cell element, the grid cap structure comprising a top grid-cap central region, grid-cap sides and top grid cap margins disposed between and contacting the top grid-cap central region and the grid-cap sides;

an anti-reflection layer formed of an anti-reflection material overlying and contacting the photovoltaic solar cell element in the openings of the front current-collection grid cap structure, wherein the anti-reflection layer is thinner at a location immediately adjacent to the front current-collection grid cap structure than at a location remote from the front current-collection grid cap structure;

an edge stripe of the anti-reflection material completely overlying the top grid-cap margins but not in the top grid-cap central region; and a metallic electrical current collector overlying and contacting the top grid-cap central region and at least some of the edge stripe, but not contacting the top grid cap margins, the grid-cap sides, the anti-reflection layer and not contacting the photovoltaic solar cell element.

12. The solar cell structure of claim 11, further including a side layer of the anti-reflection material overlying and contacting the grid-cap side.

13. The solar cell structure of claim 11, further including a concentrator that concentrates solar energy onto the photovoltaic solar cell element.

* * * * *